(12) United States Patent
Toguchi et al.

(10) Patent No.: US 8,309,992 B2
(45) Date of Patent: Nov. 13, 2012

(54) SWITCHING ELEMENT INCLUDING CARBON NANOTUBES AND METHOD FOR MANUFACTURING THE SAME

(75) Inventors: Satoru Toguchi, Tokyo (JP); Hideaki Numata, Tokyo (JP); Hiroyuki Endoh, Tokyo (JP)

(73) Assignee: NEC Corporation, Tokyo (JP)

( * ) Notice: Subject to any disclaimer, the term of this patent is extended or adjusted under 35 U.S.C. 154(b) by 398 days.

(21) Appl. No.: 12/676,218

(22) PCT Filed: Sep. 8, 2008

(86) PCT No.: PCT/JP2008/066174
§ 371 (c)(1),
(2), (4) Date: Mar. 3, 2010

(87) PCT Pub. No.: WO2009/031681
PCT Pub. Date: Mar. 12, 2009

(65) Prior Publication Data
US 2010/0163858 A1    Jul. 1, 2010

(30) Foreign Application Priority Data
Sep. 7, 2007 (JP) ................................. 2007-232598

(51) Int. Cl.
*H01L 29/76* (2006.01)
(52) U.S. Cl. ................ 257/213; 257/288; 257/E23.074; 257/E51.04
(58) Field of Classification Search .................. 257/213, 257/E23.074, E51.04
See application file for complete search history.

(56) References Cited

U.S. PATENT DOCUMENTS

| | | | |
|---|---|---|---|
| 2004/0023514 A1* | 2/2004 | Moriya et al. | 438/778 |
| 2006/0091557 A1* | 5/2006 | Sakamoto et al. | 257/774 |
| 2006/0131570 A1* | 6/2006 | Meng | 257/40 |
| 2009/0001360 A1* | 1/2009 | Nakayama | 257/40 |
| 2010/0140600 A1* | 6/2010 | Clough et al. | 257/40 |

FOREIGN PATENT DOCUMENTS

| | | |
|---|---|---|
| JP | 2004356530 A | 12/2004 |
| JP | 3751016 B | 12/2005 |
| JP | 2006240898 A | 9/2006 |
| JP | 2006303507 A | 11/2006 |
| JP | 2006351613 A | 12/2006 |

(Continued)

OTHER PUBLICATIONS

International Search Report for PCT/JP2008/066174 mailed Sep. 30, 2008.

(Continued)

*Primary Examiner* — Thao Le
*Assistant Examiner* — Allen Parker

(57) ABSTRACT

A problem of a switching element using for the active layer a carbon nanotube (CNT) dispersion film that can be manufactured at low temperature has been that sufficient electrical contact and thermal conductivity between the CNTs and the source and drain electrode surfaces are not obtained. The switching element of the present invention has a structure in which a mixed layer of carbon nanotubes and a metal material, and a metal layer of the metal material are laminated in this order on source and drain electrodes, and thereby, the CNT-dispersed film and the electrode surfaces can be in firm electrical, mechanical, and thermal contact with each other. Thus, a switching element exhibiting good and stable transistor characteristics is obtained with a low-temperature, convenient, and low-cost process.

12 Claims, 1 Drawing Sheet

FOREIGN PATENT DOCUMENTS

JP       2007012665 A       1/2007

OTHER PUBLICATIONS

S. Hur et al., "Extreme bendability of single-walled carbon nanotube networks transferred from high-temperature growth substrates to plastic and their use in thin-film transistors", Applied Physics Letters 86, 243502-1-243502-3, 2005.

E. S. Snow et al., "Random networks of carbon nanotubes as an electronic material", Applied Physics Letters, vol. 82. No. 13, Mar. 31, 2003, pp. 2145-2147.

T. Takenobu et al., "High-performance transparent flexible transistors using carbon nanotube films", Applied Physics Letters 88, 033511-1-033511-3, 2006.

E. Artukovic et al., "Transparent and Flexible Carbon Nanotube Transistors", Nano Letters, vol. 5, No. 4, 2005, pp. 757-760.

* cited by examiner

SWITCHING ELEMENT INCLUDING CARBON NANOTUBES AND METHOD FOR MANUFACTURING THE SAME

This application is the National Phase of PCT/JP2008/066174, filed Sep. 8, 2008, which claims priority to Japanese Patent Application No. 2007-232598 filed Sep. 7, 2007, the entire disclosure of which is incorporated herein.

TECHNICAL FIELD

The present invention relates to a switching element using carbon nanotubes (CNTs) in an active layer.

BACKGROUND ART

Thin film transistors (TFTs) have been widely used as pixel switching elements for displays, such as liquid crystal displays and EL displays. Also, examples in which the driver circuit for the pixel array is also formed by a TFT on the same substrate have increased in recent years. Such TFTs have been conventionally made on a glass substrate, using amorphous and polycrystalline silicon.

However, problems have been that CVD apparatuses used for making such TFTs using silicon are very expensive, and that a larger area of displays and the like using TFTs involves a significant increase in manufacturing cost. Also, since the process of forming a film of amorphous or polycrystalline silicon is performed at very high temperature, there has been such a restriction that materials that can be used as the substrate are limited, and lightweight resin substrates and the like cannot be used.

TFTs using a CNT-dispersed film as the semiconductor material have been proposed as means for solving such problems. The CNT-dispersed film is usually formed by a wet process, such as application. This process has such advantages that a larger area can be achieved at low cost, and that restrictions in selecting a material used as the substrate are few because the process temperature is low. Therefore, the practical use of the TFTs using the CNT-dispersed film has been expected. In fact, the TFTs using the CNT-dispersed film have been frequently reported in recent years, and there are examples of reports, such as Non-Patent Documents 1 to 4.

Non-Patent Document 1: E. S. Snow, J. P. Novak, P. M. Campbell, D. Park, Applied Physics Letters, Vol. 82, p. 2145, 2003
Non-Patent Document 2: E. Artukovic, M. Kaempgen, D. S. Hecht, S. Roth, G. Gruener, Nano Letters, Vol. 5, p. 757, 2005
Non-Patent Document 3: S.-H. Hur, O. O. Park, J. A. Rogers, Applied Physics Letters, Vol. 86, p. 243502, 2005
Non-Patent Document 4: T. Takenobua, T. Takahashi, T. Kanbara, K. Tsukagoshi, Y. Aoyagi, Y. Iwasa, Applied Physics Letters, Vol. 88, p. 33511, 2006

DISCLOSURE OF THE INVENTION

Problems to be Solved by the Invention

In such TFTs using the CNT-dispersed film, there is a bottom contact structure in which the source electrode and the drain electrode are present under the CNT-dispersed film. In this case, in the portions of the CNT-dispersed film located on the electrodes, only CNTs in the lowest layer are in contact with the electrode surfaces by weak intermolecular force, thereby, the electrical contact between the electrodes and the CNT-dispersed film are formed. CNTs that overlap other CNTs and cannot be in contact with the electrode surfaces cannot contribute to contact with the electrodes, and therefore, even if the CNT concentration in the dispersion film is constant, the contact resistance with the electrodes varies depending on the location of the CNTs in the dispersion film. This has been a cause of variations in the performance of the entire switching element. Also, since the interaction between the CNT and the electrode surfaces is not sufficient, the electrical contact between the electrodes and the CNT-dispersed film are easily lost due to the deformation of the element caused by the accumulation of heat generated during the bending and straightening of the substrate and driving, or due to the elapse of time, which has made an improvement in the stability of the element difficult.

On the other hand, there is a top contact structure in which the source electrode and the drain electrode are present on the CNT-dispersed film. In this case, even if a dry process, such as vapor deposition, is used for forming the source electrode and the drain electrode, a structure in which the CNT-dispersed film is sandwiched between the substrate and the gate insulating film and the electrodes is provided. Therefore, mechanical deformation and change over time are suppressed to some extent. But, a problem has been that variations in electrical contact cannot be sufficiently suppressed, for example, voids are formed between the CNTs and the substrate or the insulating film due to the shadow effect during film manufacture.

It is an object of the present invention to provide a switching element exhibiting good and stable transistor characteristics with a low-temperature, convenient, and low-cost process.

Means for Solving the Problems

The present invention has a structure in which a source electrode or a drain electrode, a mixed layer of carbon nanotubes and a metal material, and a metal layer of the metal material are laminated in this order in a region where a CNT-dispersed film and the source electrode or the drain electrode overlap. It has been found that because of this, the electrical contact and mechanical contact between the CNT-dispersed film and each electrode can be good and stable without variations. Also, heat generated around the contact regions of the CNT-dispersed film due to the thermal conduction effect of the metal material can be effectively released to the electrodes and the wiring portions leading to these. It has been found that because of these, a switching element exhibiting good and stable transistor characteristics is obtained with a convenient and low-cost process.

Specifically, the present invention is a switching element comprising a source electrode and a drain electrode spaced from each other, an active layer in contact with both the source electrode and the drain electrode, and further a gate electrode spaced from the source/drain electrodes and being in contact with the active layer via a gate insulating layer, the switching element having a structure in which the source electrode or the drain electrode, a mixed layer of carbon nanotubes and a metal material, and a metal layer of the metal material are laminated in this order, the active layer being formed of a carbon nanotube-dispersed film comprising carbon nanotubes with semiconductor characteristics.

Also, the present invention is the switching element wherein the carbon nanotube-dispersed film is a film formed by applying a dispersion of carbon nanotubes dispersed in a liquid dispersion medium, and then removing the dispersion medium.

Also, the present invention is the switching element wherein the carbon nanotubes in the mixed layer are of the same type as the carbon nanotubes included in the carbon nanotube-dispersed film.

Also, the present invention is the switching element wherein the metal material in the mixed layer, and the metal layer have a structure in which metal particles with a diameter of 1 to 100 nm are fused to each other.

Also, the present invention is the switching element wherein the structure in which metal particles with a diameter of 1 to 100 nm are fused to each other is formed by dropping or applying a dispersion of the metal particles dispersed in a liquid dispersion medium, then removing the liquid dispersion medium, and then fusing the metal particles together.

Also, the present invention is the switching element wherein the metal material in the mixed layer, and the metal layer are formed by dropping or applying a solution of an organometallic compound or a metal salt of an organic compound, then removing the solvent, and then subjecting the organic component to decomposition treatment.

Also, the present invention is the switching element according to any of the previous paragraphs, wherein the source and drain electrodes are formed by printing or application.

Also, the present invention is a switching element wherein the above switching element is formed on a flexible substrate.

Also, the present invention is a method for manufacturing the switching element, comprising:

forming the source electrode and the drain electrode;

forming the carbon nanotube-dispersed film so as to at least overlap the source electrode and the drain electrode; and dropping or applying a dispersion of metal particles with a diameter of 1 to 100 nm dispersed in a liquid dispersion medium onto the carbon nanotube-dispersed film on the source electrode and the drain electrode, then removing the liquid dispersion medium, and then fusing the metal particles together to form the mixed layer and the metal layer.

Also, the present invention is a method for manufacturing the switching element, comprising:

forming the source electrode and the drain electrode;

forming the carbon nanotube-dispersed film so as to at least overlap the source electrode and the drain electrode; and dropping or applying a solution of an organometallic compound or a metal salt of an organic compound onto the carbon nanotube-dispersed film on the source electrode and the drain electrode, then removing the solvent, and then subjecting the organic component to decomposition treatment to form the mixed layer and the metal layer.

Also, the present invention is the method for manufacturing a switching element, wherein the carbon nanotube-dispersed film is formed by applying a dispersion of the carbon nanotubes dispersed in a liquid dispersion medium, and then removing the liquid dispersion medium.

Also, the present invention is a method for manufacturing the switching element, comprising:

dropping or applying a dispersion of metal particles with a diameter of 1 to 100 nm dispersed in a liquid dispersion medium onto at least part of sites on a substrate where the source electrode and the drain electrode are to be formed, then removing the liquid dispersion medium, and then fusing the metal particles together to form the metal layer;

applying a dispersion of the carbon nanotubes dispersed in a liquid dispersion medium onto at least regions overlapping the metal layer, and then removing the liquid dispersion medium to form the active layer composed of the carbon nanotube-dispersed film;

dropping or applying the dispersion onto regions where the metal layer and the active layer overlap, removing the liquid dispersion medium, and then fusing the metal particles together to form the mixed layer; and forming the source electrode and the drain electrode at least in contact with the mixed layer.

Also, the present invention is a method for manufacturing the switching element, comprising:

dropping or applying a solution of an organometallic compound or a metal salt of an organic compound onto at least part of sites on a substrate where the source electrode and the drain electrode are to be formed, then removing the solvent, and then subjecting the organic component to decomposition treatment to form the metal layer;

applying a dispersion of the carbon nanotubes dispersed in a liquid dispersion medium onto at least regions overlapping the metal layer, and then removing the liquid dispersion medium to form the active layer composed of the carbon nanotube-dispersed film;

dropping or applying the solution of the organometallic compound or the metal salt of the organic compound onto regions where the metal layer and the active layer overlap, removing the solvent, and then subjecting the organic component to decomposition treatment to form the mixed layer; and forming the source electrode and the drain electrode at least in contact with the mixed layer.

Advantage of the Invention

According to the present invention, a switching element exhibiting good and stable transistor characteristics can be obtained with a low-temperature, convenient, and low-cost process.

DESCRIPTION OF SYMBOLS

Figure 1:
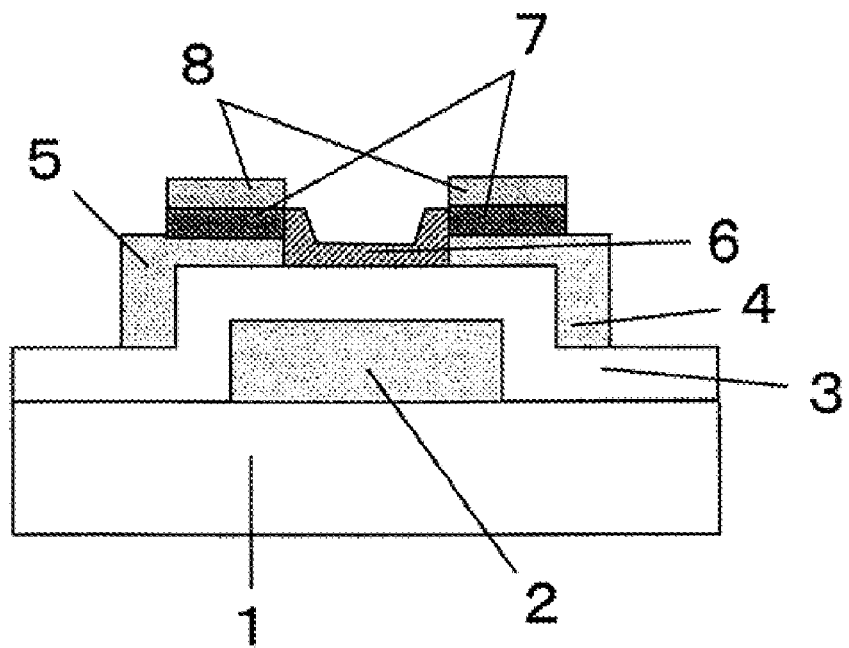
FIG. 1 is one example of a cross-sectional view of the switching element of the present invention.

1 . . . supporting substrate
2 . . . gate electrode
3 . . . gate insulating film
4 . . . source electrode
5 . . . drain electrode
6 . . . active layer (CNT-dispersed film)
7 . . . mixed layer
8 . . . metal layer

BEST MODE FOR CARRYING OUT THE INVENTION

[Description of Configuration]

The configuration of the switching element of the present invention will be described below.

One example of the structure of the switching element of the present invention is shown in FIG. 1. A gate insulating film 3 is formed in contact with a gate electrode 2 formed on a supporting substrate 1. Further, a source electrode 4 and a drain electrode 5 are located on the gate insulating film 3, spaced from each other at a distance corresponding to channel length. Further, an active layer (CNT-dispersed film) 6 is located in contact with all of the gate insulating film 3, the source electrode 4, and the drain electrode 5. A mixed layer 7 in which a metal material is located in voids between CNTs, and a metal layer 8 formed of this metal material are laminated in order on portions where the source electrode 4 and the drain electrode 5 overlap the CNT-dispersed film 6, thereby, the switching element of the present invention is obtained.

Figure 2:
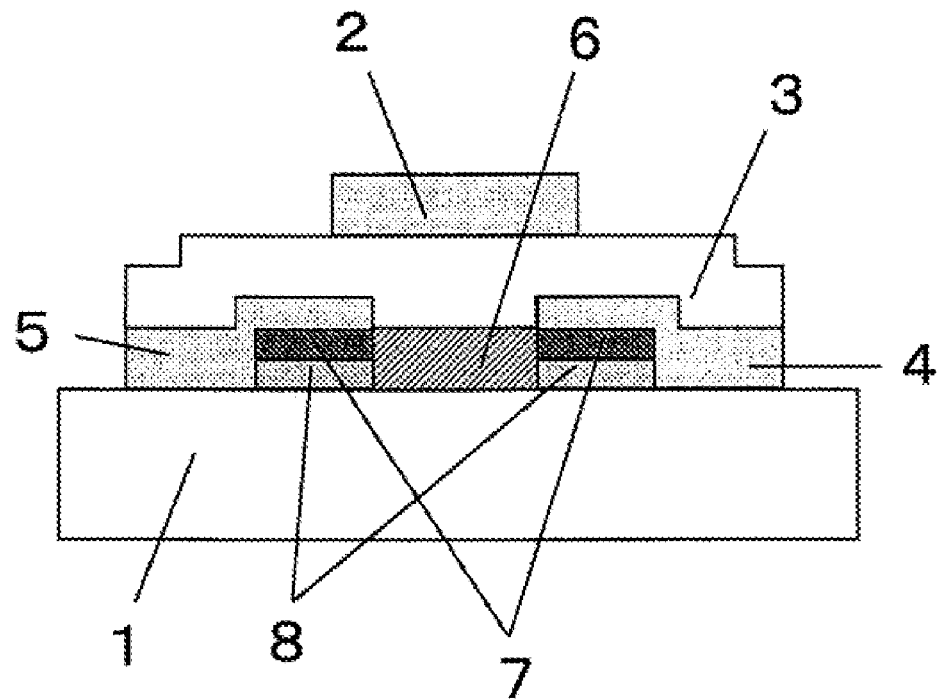
FIG. 2 is another example of a cross-sectional view of the switching element of the present invention.

Another example of the structure of the switching element of the present invention is shown in FIG. 2. The active layer (CNT-dispersed film) 6 is formed on the supporting substrate 1. The source electrode 4 and the drain electrode 5 are located thereon, spaced from each other at a distance corresponding to channel length. The mixed layer 7 in which a metal material is located in voids between CNTs is formed under the source electrode 4 and the drain electrode 5, and a structure in which the metal layer 8 is sandwiched between the mixed layer 7 and the supporting substrate 1 is provided. Further, the gate insulating film 3 is formed on a region that becomes a channel, and further, the gate electrode 2 is formed on the gate insulating film 3, thereby, the switching element of the present invention is obtained.

Here, any metal material having sufficient electrical contact and thermal contact with CNTs can be used as the metal material forming the mixed layer 7 and the metal layer 8. Examples of the metal material include, but are not limited to, metals and alloys, such as gold, silver, platinum, copper, indium, aluminum, magnesium, a magnesium-indium alloy, a magnesium-aluminum alloy, an aluminum-lithium alloy, and a magnesium-silver alloy.

Any method that can sufficiently fill voids between CNTs in the CNT-dispersed film with the metal material can be used as the method for forming the mixed layer 7. In addition to dry processes, such as vacuum deposition, sputtering, and CVD, wet processes, such as application, for example, spin coating and bar coating, dropping, for example, casting, and further, methods using printing processes, can also be used. Particularly, the wet processes are preferred, which can conveniently fill the voids and are also superior in cost because they do not use a vacuum process.

Similarly, methods similar to those mentioned as the method for forming the mixed layer 7 can be used as the method for forming the metal layer 8. The use of the wet processes is also preferred for this method, in view of superiority in cost.

Also, the metal material in the mixed layer 7, and the metal layer 8 preferably have a structure in which minute metal particles are fused to each other. Having the structure can achieve sufficient conductivity, and metal-CNT contact, while filling the complicated voids between the CNTs in the mixed layer 7. Also, forming the metal layer 8 and the metal material in the mixed layer 7 having the same structure enhances mutual continuity and can achieve an improvement in mechanical strength.

The minute metal particles are metal particles with a diameter of 1 to 100 nm and are formed by subjecting an organometallic compound to reduction treatment and the like.

Also preferred is a method for forming the metal material in the mixed layer 7, and the metal layer 8 by dropping or applying a minute metal particle dispersion of the minute metal particles dispersed in a liquid dispersion medium, then removing the dispersion medium, and then fusing the metal particles together. Examples of the liquid dispersion medium include, but are not limited to, water and a mixed solvent of water and alcohol. Also, the metal particles after the application can be fused by heat treatment or ultraviolet irradiation treatment.

Also preferred is a method for forming the metal material in the mixed layer 7, and the metal layer 8 by dropping or applying a solution of an organometallic compound or a metal salt of an organic compound, then removing the solvent, and then subjecting the organic substance to decomposition treatment. A solution of an organometallic compound or metal atoms and a salt of an organic substance is applied, and then, the organic substance is subjected to decomposition treatment by heat treatment, ultraviolet irradiation treatment, or the like, thereby, the target material can be obtained.

Any material on which the switching element can be formed can be used as the supporting substrate used in the present invention, and the supporting substrate may be a flexible substrate. Examples of the supporting substrate include not only inorganic materials, such as glass, quartz, and a silicon wafer, but also polymer materials, such as polyethylene type resins, for example, polyethylene sulfide, polyethylene naphthalate, and polyethylene terephthalate, as well as a polyamide type and a polycarbonate type, and the like. But, the supporting substrate is not particularly limited to these.

The CNTs used in the present invention are not particularly limited as long as they exhibit sufficient semiconductor characteristics in the dispersion film. The method for manufacturing CNTs is also not particularly limited, and any CNTs obtained by conventionally known manufacturing methods, such as arc discharge, laser ablation, and CVD, can be used. Two types, single-wall nanotubes (SWNTs) comprising a single carbon layer, and multi-wall nanotubes (MWNTs) comprising a plurality of carbon layers, are originally known for CNTs. For the SWNTs, those exhibiting semiconductor characteristics, and those with metallic properties are present. The MWNTs are formed by randomly combining these. CNTs exhibiting metallic properties present in the dispersion film can be a factor of an increase in off-state current. Therefore, it can be said that the ratio of the CNTs in the dispersion film is desirably as low as possible in applications where low power consumption is required, but this is not particularly limited. The CNTs in the mixed layer may be of the same type as the CNTs included in the CNT-dispersed film.

Examples of a method for locating the CNTs in the channel region as the dispersion film include, but are not particularly limited to, a wet method in which CNTs are dispersed in a liquid solvent, and then, the dispersion is applied or sprinkled, a dry method in which disaggregated CNTs are carried by a carrier gas flow and sprinkled on the location surface, and the like. However, among these, the wet method is preferred because the process is easy, and the loss of the CNTs used is small, compared with the dry method. Examples of the liquid dispersion medium in which the CNTs are dispersed in the wet method include, but are not limited to, water as well as general organic solvents, such as alcohols, ethers, esters, alkylamides, aliphatic hydrocarbons, and aromatic compounds. Any method used in general dispersion steps for pigments and the like, such as kneading, for example, stirring and milling, as well as ultrasonic irradiation, can be used as the dispersion. A suitable surfactant or binder may be added for the promotion or maintenance of the dispersion. In addition to film formation, such as spin coating and blade coating, dropping by a dispenser, and printing, such as an ink jet method, can also be used as the method for applying or sprinkling the CNT dispersion.

Also, the materials used for the electrodes of the source, drain, and gate of the switching element of the present invention are not particularly limited as long as they have sufficient electrical conductivity. But, for the electrode functioning as a charge injecting electrode, those with excellent charge injection properties for CNTs are more desired. Examples thereof include, but are not limited to, metals and alloys, such as an indium tin oxide alloy (ITO), tin oxide (NESA), gold, silver, platinum, copper, indium, aluminum, magnesium, a magnesium-indium alloy, a magnesium-aluminum alloy, an aluminum-lithium alloy, and a magnesium-silver alloy, or oxides thereof, as well as organic materials, such as electrically conductive polymers.

The methods for forming the electrodes of the source, drain, and gate of the switching element of the present invention are not particularly limited. General thin film formation, such as conventionally publicly known vacuum deposition, spin coating, sputtering, and CVD, as well as application, and application and sintering, can be used. Also for the patterning, general photolithography, as well as printing and the like can be applied. But, the patterning is not particularly limited as long as it is a method that can achieve the desired electrode pattern.

Also, examples of the material used for the insulating film of the switching element of the present invention include inorganic insulators used for general purposes, such as $SiO_2$, SiNx, and alumina, as well as high dielectric constant materials, such as titanium oxide, tungsten oxide, and tantalum oxide, and the like. Further, insulating polymers, such as polyamide, polyethylene naphthalate, and polyethylene terephthalate, and the like can also be used. General thin film formation, such as dry processes, for example, conventionally publicly known vacuum deposition, sputtering, and CVD, as well as application, and application and sintering, and printing, such as an ink jet method, can be used as the method for forming the insulating film.

EXAMPLES

Exemplary embodiments will be illustrated below. However, the present invention is not limited to these.

Example 1

FIG. 1 is a structure view of a switching element in Example 1 of the present invention. A switching element making process in Example 1 will be described below.

A 100 nm aluminum film as the gate electrode 2 was formed on a 0.5 mm thick polyethylene naphthalate substrate through a shadow mask by sputtering. A 180 nm poly-p-xylylene film as the gate insulating film 3 was formed on this supporting substrate 1 by vapor deposition polymerization. Gold as the source electrode 4 and the drain electrode 5 was vapor-deposited on the poly-p-xylylene film by vacuum deposition to form a film with a film thickness of 60 nm, and patterning was performed by lift-off. The electrode structure formed here had a channel width of 1000 μm and a channel length of 300 μm. Further, a dispersion obtained by adding SWNTs to a 0.01% aqueous solution of sodium dodecylsulfonate and performing ultrasonic treatment for 1 hour for dispersion was applied thereon by spin coating. Then, heating was performed at 120° C. for 30 minutes to remove the solvent to form the active layer (CNT-dispersed film) 6. "DCG-312-CN10" (trade name), a dispersion of fine silver particles (diameter: 3 to 10 nm) manufactured by Sumitomo Metal Mining Co., Ltd., was dropped, using a dispenser, on regions where this CNT-dispersed film 6 overlapped the source electrode and the drain electrode. Then, heating was performed at 150° C. for 60 minutes to perform the treatment of fusing the silver particles together. The dropping of the dispersion of silver particles and the fusion treatment were further repeated once more to form the mixed layer 7 and the metal layer 8 to obtain the target switching element.

30 switching elements were made in this manner, and the transistor characteristics of the obtained switching elements were measured. The on/off ratio (the ratio of the source-drain current at a source-drain bias of −4V between at gate voltage=−10V during the on state and at gate voltage=+10V during the off state, the same applies hereinafter) was about $10^3$ for all, and the current value during the on state was in the range of 110±15 μA for all. The operation of bending this element in the channel length direction into the shape of a cylinder with a radius of 10 mm such that the element was on the inside, and returning the element to a plane was performed 20 times, and then, similar transistor characteristics were measured. At this time, the on/off ratio was about $10^3$ for all, and the amount of change in the current value during the on state before and after the bending operation was 2 to 8 μA for all. Further, current was continuously passed for 100 hours, with this element in the on state, and then, the transistor characteristics were measured again. The on/off ratio was about $8 \times 10^2$ for all, and the current value during the on state was in the range of 105±19 μA for all.

Comparative Example 1

A 100 nm aluminum film as the gate electrode 2 was formed on a 0.5 mm thick polyethylene naphthalate substrate through a shadow mask by sputtering. A 180 nm poly-p-xylylene film as the gate insulating film 3 was formed on this substrate by vapor deposition polymerization. Gold as the source electrode 4 and the drain electrode 5 was vapor-deposited on the poly-p-xylylene film by vacuum deposition to form a film with a film thickness of 60 nm, and patterning was performed by lift-off. The electrode structure formed here had a channel width of 1000 μm and a channel length of 300 μm. Further, a dispersion obtained by adding SWNTs to a 0.01% aqueous solution of sodium dodecylsulfonate and performing ultrasonic treatment for 1 hour for dispersion was applied thereon by spin coating. Then, heating was performed at 120° C. for 30 minutes to remove the solvent to form the active layer (CNT-dispersed film) 6 to obtain a switching element.

30 switching elements were made in this manner, and the transistor characteristics of the obtained switching elements were measured. The on/off ratio was about $10^3$, and the mode of the current value during the on state was in the range of 95±15 μA. Two elements had a current value of 50% or less of this range. The operation of bending this element into the shape of a cylinder with a radius of 10 mm such that the element was on the inside, and returning the element to a plane was performed 20 times, and then, similar transistor characteristics were measured. At this time, the on/off ratio was about $10^3$ for all, and the amount of change in the current value during the on state before and after the bending operation was a value in the range of 5 to 40 μA. Further, current was continuously passed for 100 hours, with this element in the on state, and then, the transistor characteristics were measured again. The on/off ratio was about $2 \times 10^2$ for all, and the mode of the current value during the on state was in the range of 80±15 μA for all. Eight elements had a current value of 50% or less of this range.

Example 2

FIG. 2 is a structure view of a switching element in Example 2 of the present invention. A switching element making process in Example 2 will be described below. "DCG- 312-CN10" (trade name) was applied with a width of 1000 μm at a spacing of 300 μm on a 0.5 mm thick polyethylene naphthalate substrate, using a dispenser. This was heated at 150° C. for 60 minutes to perform the treatment of fusing the silver particles to obtain the metal layer 8. A CNT dispersion made by subjecting SWNTs in dichloroethane to ultrasonic treatment for 1 hour was applied thereon by dispensing, and then heated at 100° C. for 10 minutes to remove the solvent to make the active layer (CNT-dispersed film) 6. Then, "DCG-312-CN10" (trade name) was applied again on the regions where "DCG-312-CN10" (trade name) was applied in the above step, and fusion treatment was performed to form the mixed layer 7. Gold with a film thickness of 60 nm was formed by vacuum deposition by shadow masking, including the regions where "DCG-312-CN10" (trade name) was applied, and at a spacing of 300 μm, which becomes a channel, to provide the source electrode 4 and the drain electrode 5. A 250 nm poly-p-xylylene film as the gate insulating film 3 was formed thereon by vapor deposition polymerization, and then, 100 nm aluminum as the gate electrode 2 was formed so as to cover the channel portion by shadow masking to obtain the target switching element.

30 switching elements were made in this manner, and the transistor characteristics of the obtained switching elements were measured. The on/off ratio was about $10^3$ for all, and the current value during the on state was in the range of 100±15 μA for all. The operation of bending this element into the shape of a cylinder with a radius of 10 mm such that the element was on the inside, and returning the element to a plane was performed 20 times, and then, similar transistor characteristics were measured. At this time, the on/off ratio was about $10^3$ for all, and the amount of change in the current value during the on state before and after the bending operation was 1 to 9 μA for all. Further, current was continuously passed for 100 hours, with this element in the on state, and then, the transistor characteristics were measured again. The on/off ratio was about $6 \times 10^2$ for all, and the current value during the on state was in the range of 90±15 μA for all.

Comparative Example 2

A CNT dispersion made by subjecting SWNTs in dichloroethane to ultrasonic treatment for 1 hour was applied on a 0.5 mm thick polyethylene naphthalate substrate by dispensing. Then, heating was performed at 100° C. for 10 minutes to remove the solvent to make the active layer (CNT-dispersed film) 6. Gold with a film thickness of 60 nm was formed thereon through a shadow mask by vacuum deposition to provide the source electrode 4 and the drain electrode 5. The channel width was 1000 μm, and the channel length was 300 μm. A 250 nm poly-p-xylylene film as the gate insulating film 3 was formed thereon by vapor deposition polymerization, and then, 100 nm aluminum as the gate electrode 2 was formed so as to cover the channel portion by shadow masking to obtain the target switching element.

30 switching elements were made in this manner, and the transistor characteristics of the obtained switching elements were measured. The on/off ratio was about $10^3$ for all, and the mode of the current value during the on state was in the range of 85±15 μA. Five elements had a current value of 50% or less of this range. The operation of bending this element into the shape of a cylinder with a radius of 10 mm such that the element was on the inside, and returning the element to a plane was performed 20 times, and then, similar transistor characteristics were measured. At this time, the on/off ratio was about $10^3$ for all, and the amount of change in the current value during the on state before and after the bending operation was 5 to 25 μA for all. Further, current was continuously passed for 100 hours, with this element in the on state, and then, the transistor characteristics were measured again. The on/off ratio was about $2 \times 10^2$ for all, and the mode of the current value during the on state was in the range of 70±15 μA. Five elements had a current value of 50% or less of this range.

Example 3

A switching element making process in Example 3 will be described below. A 100 nm aluminum film as the gate electrode 2 was formed on a 0.5 mm thick polyethylene naphthalate substrate through a shadow mask by sputtering. A 180 nm poly-p-xylylene film as the gate insulating film 3 was formed on this substrate by vapor deposition polymerization. Gold as the source electrode 4 and the drain electrode 5 was vapor-deposited on the poly-p-xylylene film by vacuum deposition to form a film with a film thickness of 60 nm, and patterning was performed by lift-off. The electrode structure formed here had a channel width of 1000 μm and a channel length of 300 μm. "DCG-312-CN10" (trade name) was applied on the regions of these source electrode and drain electrode, using a dispenser, and then dried at room temperature for 10 minutes. Further, a dispersion obtained by adding SWNTs to a 0.01% aqueous solution of sodium dodecylsulfonate and performing ultrasonic treatment for 1 hour for dispersion was applied thereon by spin coating. Then, heating was performed at 120° C. for 30 minutes to remove the solvent to form the active layer (CNT-dispersed film) 6. Further, "DCG-312-CN10" (trade name) was applied on the same regions as described above, using the dispenser, and heated at 150° C. for 60 minutes to perform the treatment of fusing the silver particles together to obtain the target switching element.

30 switching elements were made in this manner, and the transistor characteristics of the obtained switching elements were measured. The on/off ratio was about $10^3$ for all, and the current value during the on state was in the range of 105±15 μA for all. The operation of bending this element into the shape of a cylinder with a radius of 10 mm such that the element was on the inside, and returning the element to a plane was performed 20 times, and then, similar transistor characteristics were measured. At this time, the on/off ratio was about $10^3$ for all, and the amount of change in the current value during the on state before and after the bending operation was 3 to 9 μA for all. Further, current was continuously passed for 100 hours, with this element in the on state, and then, the transistor characteristics were measured again. The on/off ratio was about $9 \times 10^2$ for all, and the current value during the on state was in the range of 100±19 μA for all.

Example 4

A switching element was made as in Example 1, except that the source electrode 4 and the drain electrode 5 were formed with a thin silver film by drawing with "DCG-312-CN10" (trade name) by a dispenser followed by heating at 150° C. for 60 minutes, rather than being formed by the manufacture of a gold film by vacuum deposition, and patterning by lift-off.

30 switching elements were made in this manner, and the transistor characteristics of the obtained switching elements were measured. At this time, the on/off ratio (the ratio of the source-drain current at a source-drain bias of =4V between at gate voltage=−10V during the on state and at gate voltage=+ 10V during the off state, the same applies hereinafter) was about $10^3$ for all, and the current value during the on state was in the range of 100±15 μA for all. The operation of bending this element into the shape of a cylinder with a radius of 10 mm such that the element was on the inside, and returning the element to a plane was performed 20 times, and then, similar transistor characteristics were measured. At this time, the on/off ratio was about $10^3$ for all, and the amount of change in the current value during the on state before and after the bending operation was 2 to 7 μA for all. Further, current was continuously passed for 100 hours, with this element in the on state, and then, the transistor characteristics were measured again. The on/off ratio was about $8 \times 10^2$ for all, and the current value during the on state was in the range of 95±16 μA for all.

Example 5

The target switching element was obtained as in Example 1, except that "DOTITE XA-9069" (trade name), an organic silver compound manufactured by Fujikura Kasei Co., Ltd., was used instead of "DCG-312-CN10" (trade name).

30 switching elements were made in this manner, and the transistor characteristics of the obtained switching elements were measured. At this time, the on/off ratio (the ratio of the source-drain current at a source-drain bias of −4V between at gate voltage=−10V during the on state and at gate voltage=+ 10V during the off state, the same applies hereinafter) was about $10^3$ for all, and the current value during the on state was in the range of 125±15 μA for all. The operation of bending this element into the shape of a cylinder with a radius of 10 mm such that the element was on the inside, and returning the element to a plane was performed 20 times, and then, similar transistor characteristics were measured. At this time, the on/off ratio was about $10^3$ for all, and the amount of change in the current value during the on state before and after the bending operation was 1 to 5 μA for all. Further, current was continuously passed for 100 hours, with this element in the on state, and then, the transistor characteristics were measured again. The on/off ratio was about $9 \times 10^2$ for all, and the current value during the on state was in the range of 110±17 μA for all.

The invention of this application has been described with reference to the exemplary embodiments (and Examples), but the invention of this application is not limited to the above exemplary embodiments (and Examples). Various changes that can be understood by those skilled in the art can be made in the configuration and details of the invention of this application within the scope of the invention of this application.

The invention claimed is:

1. A switching element comprising a source electrode and a drain electrode spaced from each other, an active layer in contact with both the source electrode and the drain electrode, and further a gate electrode spaced from the source/drain electrodes and being in contact with the active layer via a gate insulating layer,
the switching element having a structure in which the source electrode or the drain electrode, a mixed layer of carbon nanotubes and a metal material, and a metal layer of the metal material are laminated in this order, the active layer being formed of a carbon nanotube-dispersed film comprising carbon nanotubes with semiconductor characteristics;
wherein the carbon nanotubes in the mixed layer are of the same type as the carbon nanotubes included in the carbon nanotube-dispersed film.

2. The switching element according to claim 1, wherein the carbon nanotube-dispersed film is a film formed by applying a dispersion of carbon nanotubes dispersed in a liquid dispersion medium, and then removing the dispersion medium.

3. The switching element according to claim 1, wherein the metal material in the mixed layer, and the metal layer have a structure in which metal particles with a diameter of 1 to 100 nm are fused to each other.

4. The switching element according to claim 3, wherein the structure in which metal particles with a diameter of 1 to 100 nm are fused to each other is formed by dropping or applying a dispersion of the metal particles dispersed in a liquid dispersion medium, then removing the liquid dispersion medium, and then fusing the metal particles together.

5. The switching element according to claim 1, wherein the metal material in the mixed layer, and the metal layer are formed by dropping or applying a solution of an organometallic compound or a metal salt of an organic compound, then removing a solvent, and then subjecting an organic component to decomposition treatment.

6. The switching element according to claim 1, wherein the source and drain electrodes are formed by printing or application.

7. The switching element according to claim 1, wherein the switching element is formed on a flexible substrate.

8. A method for manufacturing a switching element according to claim 1, comprising:
forming the source electrode and the drain electrode;
forming the carbon nanotube-dispersed film so as to at least overlap the source electrode and the drain electrode; and
dropping or applying a dispersion of metal particles with a diameter of 1 to 100 nm dispersed in a liquid dispersion medium onto the carbon nanotube-dispersed film on the source electrode and the drain electrode, then removing the liquid dispersion medium, and then fusing the metal particles together to form the mixed layer and the metal layer.

9. A method for manufacturing a switching element according to claim 1, comprising:
forming the source electrode and the drain electrode;
forming the carbon nanotube-dispersed film so as to at least overlap the source electrode and the drain electrode; and
dropping or applying a solution of an organometallic compound or a metal salt of an organic compound onto the carbon nanotube-dispersed film on the source electrode and the drain electrode, then removing a solvent, and then subjecting an organic component to decomposition treatment to form the mixed layer and the metal layer.

10. The method for manufacturing a switching element according to claim 8, wherein the carbon nanotube-dispersed film is formed by applying a dispersion of the carbon nanotubes dispersed in a liquid dispersion medium, and then removing the liquid dispersion medium.

11. A method for manufacturing a switching element according to claim 1, comprising:
dropping or applying a dispersion of metal particles with a diameter of 1 to 100 nm dispersed in a liquid dispersion medium onto at least part of sites on a substrate where the source electrode and the drain electrode are to be formed, then removing the liquid dispersion medium, and then fusing the metal particles together to form the metal layer;
applying a dispersion of the carbon nanotubes dispersed in a liquid dispersion medium onto at least regions overlapping the metal layer, and then removing the liquid dispersion medium to form the active layer composed of the carbon nanotube-dispersed film;
dropping or applying the dispersion of metal particles onto regions where the metal layer and the active layer overlap, removing the liquid dispersion medium, and then fusing the metal particles together to form the mixed layer; and forming the source electrode and the drain electrode at least in contact with the mixed layer.

12. A method for manufacturing a switching element according to claim 1, comprising:

dropping or applying a solution of an organometallic compound or a metal salt of an organic compound onto at least part of sites on a substrate where the source electrode and the drain electrode are to be formed, then removing a solvent, and then subjecting an organic component to decomposition treatment to form the metal layer;

applying a dispersion of the carbon nanotubes dispersed in a liquid dispersion medium onto at least regions overlapping the metal layer, and then removing the liquid dispersion medium to form the active layer composed of the carbon nanotube-dispersed film;

dropping or applying the solution of the organometallic compound or the metal salt of the organic compound onto regions where the metal layer and the active layer overlap, removing the solvent, and then subjecting the organic component to decomposition treatment to form the mixed layer; and forming the source electrode and the drain electrode at least in contact with the mixed layer.

* * * * *